United States Patent [19]

Oshima et al.

[11] Patent Number: 4,596,942
[45] Date of Patent: Jun. 24, 1986

[54] FIELD EMISSION TYPE ELECTRON GUN

[75] Inventors: Chuhei Oshima; Yoshio Ishizawa, both of Sakura, Japan

[73] Assignee: National Institute for Researches in Inorganic Materials, Ibaraki, Japan

[21] Appl. No.: 579,950

[22] Filed: Feb. 14, 1984

[30] Foreign Application Priority Data

Jun. 17, 1983 [JP] Japan .................... 58-108890
Jun. 17, 1983 [JP] Japan .................... 58-108891

[51] Int. Cl.⁴ .................... H01J 1/16; H01J 3/02; H01J 1/22; H01J 19/10
[52] U.S. Cl. .................... 313/341; 313/336; 313/337; 315/1
[58] Field of Search ............ 313/341, 337, 336, 359.1, 313/360.1, 361.1, 362.1, 363.1; 315/1

[56] References Cited

U.S. PATENT DOCUMENTS 3,775,630 11/1973 Minamikawa et al. ............ 313/336
4,019,077 4/1977 Sakitani ............................ 313/336
4,396,861 8/1983 Hoffmeister et al. ............. 313/336

Primary Examiner—David K. Moore
Assistant Examiner—M. Razavi
Attorney, Agent, or Firm—Oblon, Fisher, Spivak, McClelland & Maier

[57] ABSTRACT

A field emission type electron gun comprises a cathode, a plurality of anodes opposing in series to the cathode and a filament for heating the anodes, all being contained in a vacuum tube. The filament is placed immediately before a first anode directly opposing the cathode in a symmetrical manner so as to serve both as a gas expelling member and as an anode.

6 Claims, 3 Drawing Figures

FIELD EMISSION TYPE ELECTRON GUN

BACKGROUND OF THE INVENTION

1. Field of the Invention

The present invention relates to a field emission type electron gun useful for e.g. electron beam exposure devices or electron beam devices for high brightness.

2. Description of the Prior Art

A typical conventional field emission type electron gun is illustrated in FIG. 1, wherein a Butler's anode is employed as the anode. A filament 4 for heating a first anode 2 to generate a gas is disposed obliquely above the first anode 2 in order to avoid a disturbance of the electric field which is likely to take place if the filament is disposed immediately above the first anode 2. In the Figure, reference numeral 1 designates a cathode, numeral 3 designates a second anode, numeral 5 designates a vacuum tube, numeral 6 designates a power source for heating the filament 4, and numeral 7 designates a power source for emission of electrons.

In such an electron gun, the first anode 2 is heated by the filament 4 (which is heated at a temperature of about 2500° C.) disposed obliquely thereabove, and the temperature of the surface of the first anode 2 will be as low as some hundreds degrees in centigrade, whereby e.g. oxygen atoms having strong bond strength will be retained on the surface of the first anode 2 while adsorbed molecules (e.g. water) having a small bonding energy can be removed. Accordingly, with an increase of the emission current, there will be an increase in the probability of the liberation or ionization of the adsorbed gas caused by excitation of electrons. The liberated molecules, atoms or ions are likely to be adsorbed or impinge on the surface of the cathode 1, and thus tend to change the work function of the electron emitting surface. Thus, there has been a difficulty that the emission current tends to be unstable.

SUMMARY OF THE INVENTION

Accordingly, it is an object of the present invention to solve the above-mentioned difficulty inherent to the conventional electron gun and to provide a field emission type electron gun whereby the emission current is extremely stable.

The foregoing and the other objects of the present invention have been attained by providing a field emission type electron gun comprising a cathode, a plurality of anodes opposing in series to the cathode and a filament for heating the anodes, all being contained in a vacuum tube, characterized in that the filament is placed immediately before a first anode directly opposing the cathode in a symmetrical manner so as to serve both as a gas expelling member and as an anode.

DETAILED DESCRIPTION OF THE PREFERRED EMBODIMENTS

Figure 1:
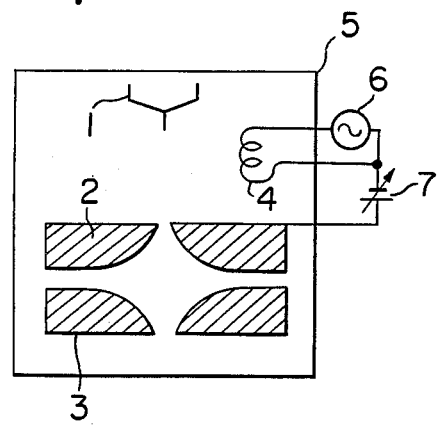
FIG. 1 is a schematic cross-sectional view of a conventional field emission type electron gun.
Figure 2:
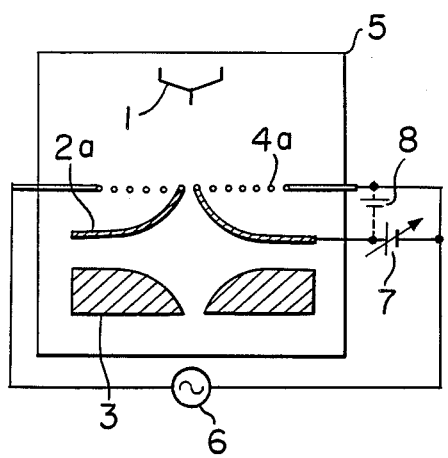
FIG. 2 is a schematic cross-sectional view of an embodiment of the field emission type electron gun of the present invention.
Figure 3:
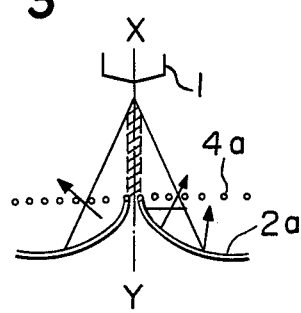
FIG. 3 is a diagram showing the direction of the gas released from the first anode of the field emission type electron gun of the present invention.

An embodiment of the present invention will be described with reference to FIGS. 2 and 3. In the Figures, reference numeral 2a designates a first anode and numeral 4a designates a filament made of such material as tungsten or tantalum and placed immediately before the first anode 2a with respect to a cathode 1 and symmetrical with the first anode 2a. The filament 4a is connected to a power source 6 for heating the filament. The heated filament 4a acts on the first anode 2a so as to expel a gas from the anode 2a. A second power source 8 is connected between the filament 4a and the first anode 2a to apply to the filament 4a a voltage substantially same as or slightly lower than that of the first anode 2a so that the filament 4a functions as an anode. The filament 4a, which may have a shape of vortes or coaxial circles, is placed in a plane substantially perpendicular to the central axis of an electron beam emitted from the cathode 1 to the first anode 2a in a vacuum tube 5. The numeral 3 designates a second anode, 6 designates a power source for heating the filament 4a and 7 designates a power source for emission of electrons. The description concerning the other structural elements in the field emission type electron gun is omitted since these elements are the same as the conventional ones.

In the field emission type electron gun of the present invention, since the filament 4a is placed immediately before the first anode 2a symmetrically and is applied with a voltage substantially the same as or slightly lower than that of the first anode 2a, the first anode 2a is uniformly heated at a high temperature so that a gas is easily and sufficiently expelled from the first anode 2a. Electrons emitted from the cathode first impinge on the filament 4a. However, since the filament 4a is heated at a temperature as high as about 2500° C. for the removal of the gas and there remain almost no absorbed molecules, there will be almost no atoms and ions to be released from the filament by the impingement. Further, since the filament 4a functions as an anode, ions generated from the surface of the first anode 2a are thereby expelled to return to the first anode side, whereby the ions are prevented from impinging on the cathode 1. Accordingly, extremely stable emission current can be obtained by the combined effects of the two functions of the filament 4a.

In the present invention, it is preferable to use a horn-shaped plate as the first anode 2a. The first anode of the horn-shaped plate is placed in such a manner that the reduced diameter end is substantially flush with a plane where the filament 4a is placed or is slightly behind the plane with respect to the cathode 1. The slope of the horn shape of the first anode 2a is steepest at the reduced diameter end, gradually decreases towards the flared skirt portion and is substantially zero at the enlarged diameter end.

With the shape of the first anode 2a being such, a space is provided between the surface of the first anode 2a and the filament 4a. When a positive potential is applied between the first anode 2a and the filament 4a, ions emitted from the first anode into the space are readily be expelled to return to the first anode side, whereby the variation of potential distribution will be minimized.

When the filament 4a is heated at, for example, about 2500° C. to drive a gas out from the first anode 2a placed near and symmetrically with the filament 4a, the first anode 2a can be uniformly heated at a temperature higher than 1500° C. because the anode is made of a sheet material and the thermal capacity and the thermal conductivity are small. Thus, the gas is thereby efficiently and thoroughly removed from the first anode, whereby the generation of gas is remarkably reduced during the operation of the electron gun.

As ions impinging on the electron emission surface of the cathode, there are ones directly emitted from the first anode and others which are first released in the form of molecules and atoms and then ionized by excitation of the electron beam. The former can be substantially reduced by the above-mentioned gas removal and the expelling of the generated gas towards the anode side. The latter can be also reduced by the use of the horn-shaped plate as the first anode. Namely, as shown in FIG. 3, a gas released from the first anode 2a is directed away from the central axis X-Y of the electron beam whereby the probability that the electron beam excites the gas is minimized, and hence ionization of gas is minimized.

Further, since the distance between the cathode 1 and the filament 4a is greater than that in the conventional electron gun in which the filament is disposed obliquely above the first anode, the possible impingement, on the cathode, of electrons or ions generated during the gas removal operation, is minimized.

What is claimed is:
1. A field emission type electron gun comprising:
a cathode,
a plurality of anodes opposite, in series, to said cathode; and
a filament for heating said anodes, wherein said cathode, said plurality of anodes and said filament are all contained in a vacuum tube, wherein said filament is placed proximal to a first anode having a first voltage and being directly opposite said cathode in a symmetrical manner so as to serve both as a gas expelling member and as an anode and wherein a power source is connected between said filament and said first anode in order to apply to said filament a voltage substantially equal to or slightly lower than said first voltage of said first anode.

2. A field emission type electron gun according to claim 1, wherein said anode is a horn-shaped plate.

3. A field emission type electron gun according to claim 1, wherein said filament is provided in a plane substantially perpendicular to the central axis of an electron beam emitted from said cathode to said anodes.

4. A field emission type electron gun according to claim 1, wherein said filament is formed in a shape of vortex or coaxial circles.

5. A field emission type electron gun according to claim 2, wherein the slope of said horn-shaped plate is steepest at the reduced diameter end, gradually decreases toward the flared skirt portion and is substantially zero at the enlarged diameter end.

6. A field emission type electron gun according to claim 2, wherein the reduced diameter end of said first anode is substantially flush with said filament.

* * * * *